United States Patent [19]

Okimura

[11] Patent Number: 5,414,657
[45] Date of Patent: May 9, 1995

[54] ASYNCHRONOUS STATIC RANDOM ACCESS MEMORY DEVICE FOR PROPAGATING READ-OUT DATA BIT THROUGH SINGLE BIT LINE

[75] Inventor: Yasunori Okimura, Kanagawa, Japan
[73] Assignee: NEC Corporation, Tokyo, Japan
[21] Appl. No.: 235,698
[22] Filed: Apr. 29, 1994
[30] Foreign Application Priority Data
  May 17, 1993 [JP] Japan .................. 5-113558
[51] Int. Cl.[6] .................................. G11C 11/34
[52] U.S. Cl. .................................. 365/154; 365/156; 365/149
[58] Field of Search ........... 365/154, 155, 156, 189.01, 365/203, 149

[56] References Cited
U.S. PATENT DOCUMENTS
4,532,609  7/1985  Iizuka .................. 365/154
4,703,456 10/1987  Arakawa ............... 365/154
4,768,172  8/1988  Sasaki .................. 365/154

FOREIGN PATENT DOCUMENTS
1112588 1/1989 Japan .................. 365/189.01
4205787 7/1992 Japan .................. 365/189.01

Primary Examiner—Joseph A. Popek
Assistant Examiner—Vu Le
Attorney, Agent, or Firm—Whitham, Curtis, Whitham & McGinn

[57] ABSTRACT

An asynchronous static random access memory device has a bit line pair associated with a column of memory cells for writing a data bit in a flip-flop circuit of a memory cell in the form of potential difference between a pair of memory nodes and a signal bit line also associated with the column of memory cells for reading out the data bit from the flip flop in the form of high or low potential level, and a discharging transistor is gated by one of the memory nodes for producing the high or low voltage level on the single bit line; as a result, the total number of bit lines are decreased, and the flip flop circuit is expected to drive a small amount of current.

2 Claims, 3 Drawing Sheets

ASYNCHRONOUS STATIC RANDOM ACCESS MEMORY DEVICE FOR PROPAGATING READ-OUT DATA BIT THROUGH SINGLE BIT LINE

FIELD OF THE INVENTION

This invention relates to an asynchronous static random access memory device.

DESCRIPTION OF THE RELATED ART

A typical example of the asynchronous static random access memory device is illustrated in FIG. 1 of the drawings, and a static memory cell 1 is controlled with two word lines WL1 and WL2 for coupling the static memory cell 1 with two pairs of bit lines BLa/BLb and BLc/BLd.

In detail, the static memory cell 1 is implemented by a flip-flop circuit 1a associated with two pairs of n-channel enhancement type switching transistors Qn1/Qn2 and Qn3/Qn4, and the flip-flop circuit 1a comprises a series combination of a resistor R1 and an n-channel enhancement type switching transistor Qn5 coupled between a positive power voltage line Vcc and a ground voltage line and a series combination of a resistor R2 and an n-channel enhancement type switching transistor Qn6 coupled in parallel to the series combination R1/Qn5. Memory nodes N1 and N2 are provided between the resistor R1 and the n-channel enhancement type switching transistor Qn5 and between the resistor R2 and the n-channel enhancement type switching transistor Qn6, and are coupled with the gate electrodes of the n-channel enhancement type switching transistors Qn6 and Qn5, respectively. The n-channel enhancement type switching transistors Qn5 and Qn6 are selectively turned on and off, and maintain a potential difference between the memory nodes N1 and N2.

The memory nodes N1 and N2 are connectable through the pair of n-channel enhancement type switching transistors Qn1 and Qn2 with the pair of bit lines BLa and BLb, and are further connectable through the pair of n-channel enhancement type switching transistors Qn3 and Qn4 with the other pair of bit lines BLc and BLd. The word line WL1 is connected with the gate electrodes of the n-channel enhancement type switching transistors Qn1 and Qn2, and the other word line WL2 is connected with the gate electrodes of the n-channel enhancement type switching transistors Qn3 and Qn4. When one of or both of the word lines WL1 and WL2 are energized, the associated n-channel enhancement type switching transistors Qn1 to Qn4 turn on, and couple the associated bit line pair or pairs BLa/BLb and/or BLc/BLd with the memory nodes N1 and N2.

P-channel enhancement type load transistors Qp5, Qp6, Qp7 and Qp8 are coupled between the positive power voltage line Vcc and the bit lines BLa/BLb, BLc and BLd, and the gate electrode of these load transistors Qp5 to Qp8 are grounded. The ground voltage causes the p-channel enhancement type switching transistors Qp5 to Qp8, and current flows from the positive power voltage line Vcc to the bit lines BLa to BLd at all times.

Though not shown in FIG. 1, a sense amplifier is coupled with the bit line pair BLa/BLb or BLc/BLd used for the read-out operation, and develops potential differences on the bit line pair BLa/BLb or BLc/BLd.

While the word lines WL1 and WL2 are maintained in the ground voltage level, all of the n-channel enhancement type switching transistors Qn1 to Qn4 are turned off, and the bit lines BLa to BLd are charged to the positive high voltage level by means of the p-channel enhancement type load transistors Qp5 to Qp8. The reason why both bit line pairs BLa/BLb and BLc/BLd are maintained in the positive high voltage level is to prevent the potential difference between the memory nodes N1 and N2 from undesirable inversion due to a difference between the bit line pairs BLa/BLb and BLc/BLd.

The asynchronous static random access memory device encounters a problem in that the memory cell 1 occupies a large amount of real estate, and, accordingly, the integration density of memory cells is hardly increased. The large amount of occupation area is derived from the following facts.

First, the current driving capability of each n-channel enhancement type switching transistor Qn5 or Qn6 should be larger than the total current driving capability of the p-channel enhancement type load transistors Qn5/Qp6 or Qp7/Qp8 and the load resistor R1 or R2 so as to maintain the potential difference between the memory nodes N1 and N2 while both word lines WL1 and WL2 are in the positive high voltage level. In order to rapidly access the data bit stored in the memory cell 1 in the form of potential differences between the bit lines BLa/BLc and BLb/BLd, the n-channel enhancement type switching transistors Qn5 and Qn6 should be twice as large as in the current driving capability than n-channel enhancement type switching transistors incorporated in each memory cell of a standard static random access memory device where a read-out and a write-in are never carried out in asynchronous fashion. This means that a designer needs to scale up the n-channel enhancement type switching transistors Qn5 and Qn6, and the large-sized n-channel enhancement type switching transistors Qn5 and Qn6 decrease the integration density.

Second, the two pairs of bit lines BLa/BLb and BLc/BLd are necessary for the asynchronous read-out/write-in operation. The memory cells are arranged in rows and columns, and the two pairs of bit lines BLa/BLb and BLc/BLd are shared between the memory cells in one of the columns. For this reason, if the integration density of the memory cells is increased, the columns of memory cells are, accordingly, increased, and the area assigned to the bit line pairs is twice increased.

SUMMARY OF THE INVENTION

It is therefore an important object of the present invention to provide an asynchronous static random access memory device which occupies a small amount of real estate rather than the prior art asynchronous static random access memory device.

To accomplish the object, the present invention proposes to propagate either high or low voltage level indicative of a read-out data bit through a single bit line.

In accordance with the present invention, there is provided an asynchronous static random access memory device fabricated on a semiconductor chip, comprising: a) a plurality of first word lines selectively energized in a read-out operation; b) a plurality of second word lines selectively energized in a write-in operation; c) a plurality of first bit lines; d) a plurality of second bit lines respectively paired with the plurality of first bit lines for forming a plurality of bit line pairs; e) a plurality of third bit lines respectively associated with the plurality of bit line pairs for forming a plurality of bit line sets; f) a charging circuit coupled between a first source of voltage level and the plurality of bit line sets for supplying current to the plurality of bit line sets; and g) a plurality of memory cells selectively associated with the plurality of first word lines, the plurality of second word lines and the plurality of bit line sets for the read-out operation and the write-in operation, each of the plurality of memory cells comprising g-1) a memory circuit having a pair of memory nodes for storing a potential difference indicative of a data bit, g-2) a pair of first switching transistors coupled between the pair of memory nodes and the bit line pair, and gated by one of the plurality of second word lines, g3) a converting circuit responsive to a voltage level at one of the pair of memory nodes for changing a voltage level on one of the plurality of third bit lines, g4) a second switching transistor coupled between the aforesaid one of the plurality of third bit lines and the converting circuit, and gated by one of the plurality of first word lines for enabling the converting circuit to change the voltage level on the aforesaid one of the plurality of third bit lines, and g5) a capacitive element coupled with the other of the pair of memory nodes for canceling a parasitic capacitance due to the converting circuit.

BRIEF DESCRIPTION OF THE DRAWINGS

The feature and advantages of the asynchronous static random access memory device according to the present invention will be more clearly understood from the following description taken in conjunction with the accompanying drawings in which.

DESCRIPTION OF THE PREFERRED EMBODIMENT

Figure 1:
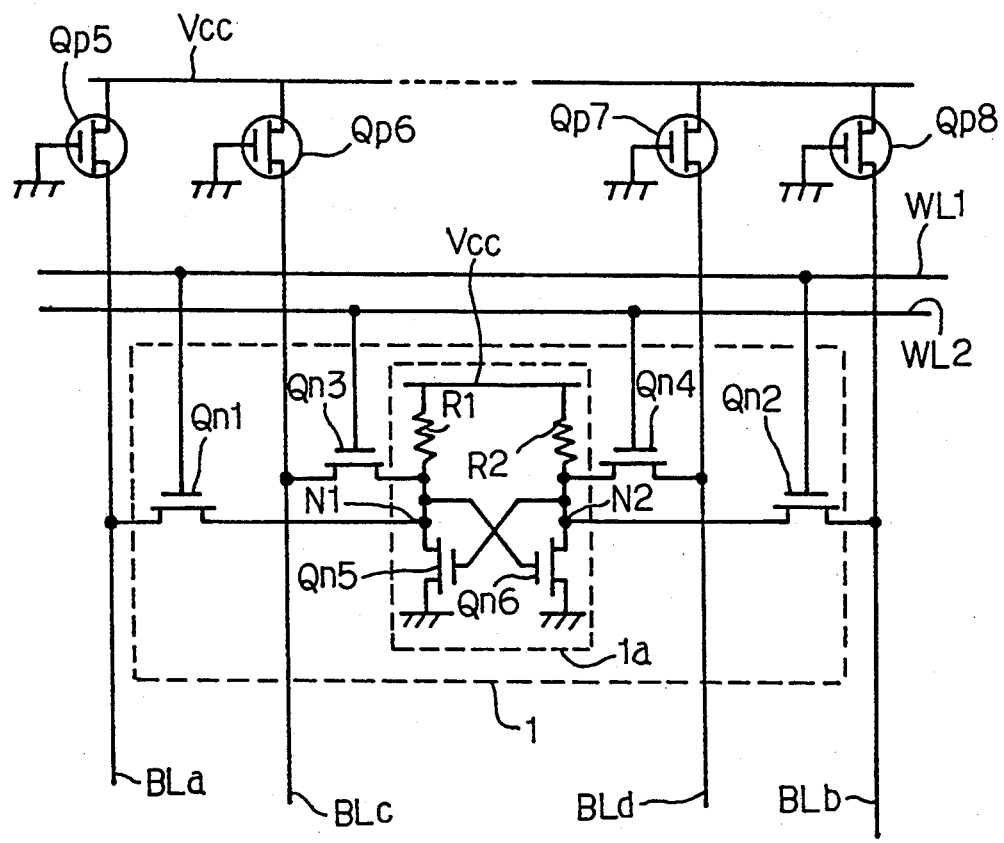
FIG. 1 is a circuit diagram showing the arrangement of the memory cell and the associated bit line pairs incorporated in the prior art asynchronous static random access memory device.
Figure 2:
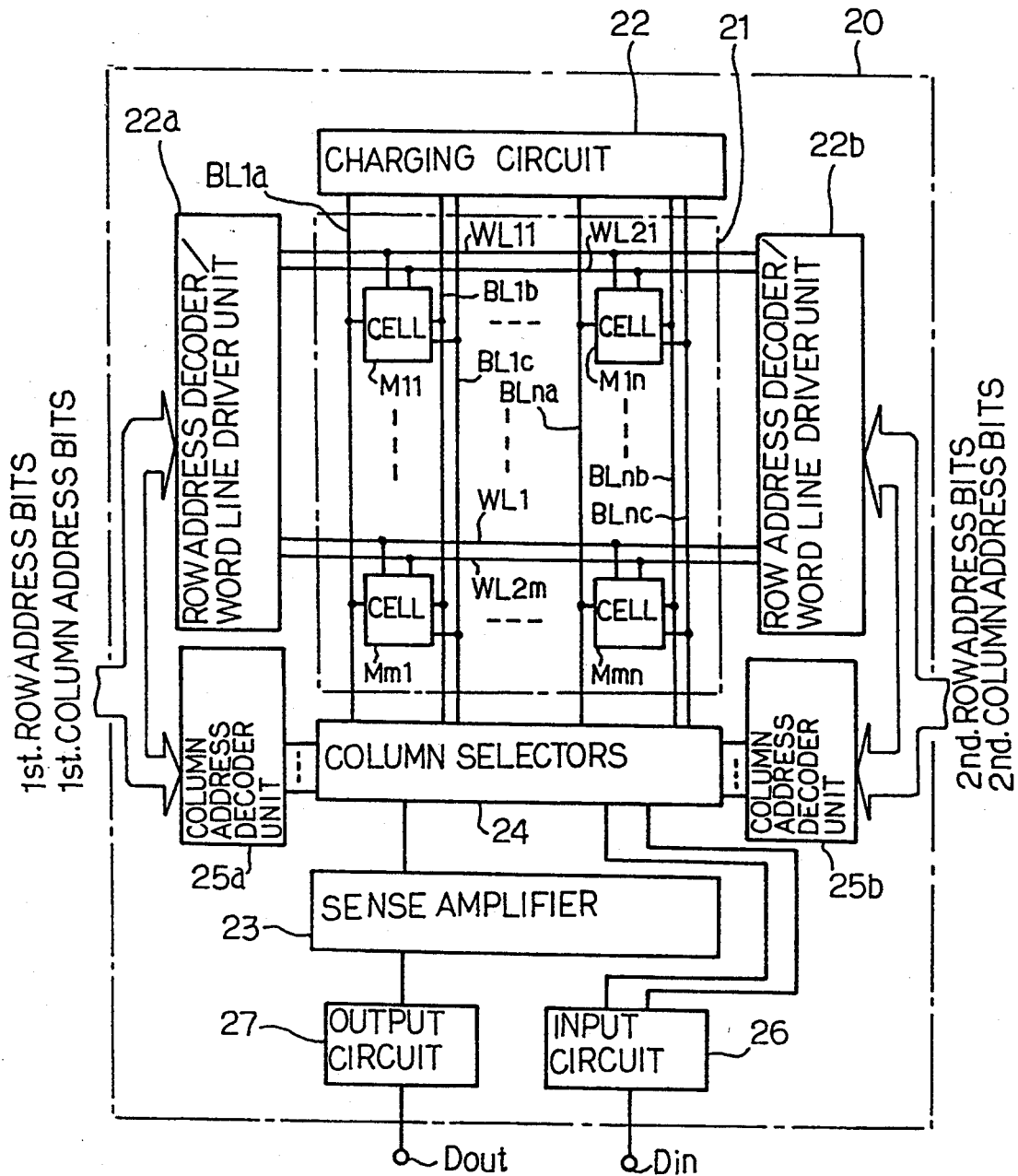
FIG. 2 is a block diagram showing the arrangement of an asynchronous static random access memory device according to the present invention.
Figure 3:
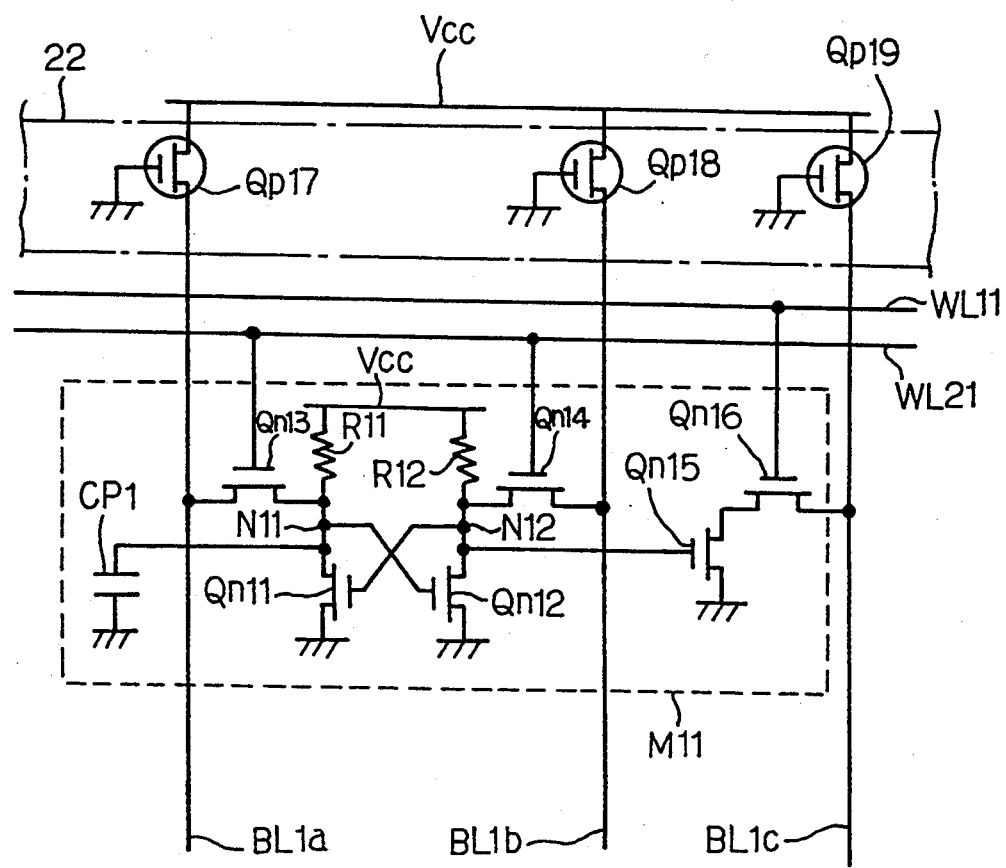
FIG. 3 is a circuit diagram showing the arrangement of a memory cell and associated bit lines incorporated in the asynchronous static random access memory device according to the present invention.

Referring to FIG. 2 of the drawings, an asynchronous static random access memory device embodying the present invention is fabricated on a semiconductor chip 20, and comprises a memory cell array 21, a plurality of sets of three bit lines BL1a/BL1b/BL1c to BLna/BLnb/BLnc, first word lines WL11 to WL1m, second word lines WL21 to WL2m, a charging circuit 22, a first row address decoder/word line driver unit 22a responsive to first row address bits for selecting one of the first word lines WL11 to WL1m, a second row address decoder/ word line driver unit 22b responsive to second row address bits for selecting one of the second word lines WL21 to WL2m, a sense amplifier 23 for amplifying a read-out data bit, first and second column selectors 24 respectively used in a read-out operation and a write-in operation, a first column address decoder unit 25a responsive to first column address bits for the read-out operation, a second column address decoder unit 25b responsive to second column address bits for the write-in operation, an input circuit 26 coupled with a data input port Din and an output circuit 27 coupled with a data output port Dout.

The memory cell array 21 is implemented by a plurality of memory cells M11, . . . M1n, . . . Mm1 . . . and Mmn arranged in rows and columns, and each of the memory cells M11 to Mmn stores a data bit in the form of potential difference. Row addresses and column addresses are assigned the plurality of memory cells M11 to Mmn, respectively.

The first word lines WL11 to WL1m are respectively paired with the second word lines WL21 to WL2m, and the word line pairs WL11/WL21 to WL1m/WL2m are respectively associated with the rows of memory cells M11 to M1n, . . . . and Mm1 to Mmn. The first word lines WL11 to WL1m are selectively energized by the first row address decoder/word line driver unit 22a for reading out an accessed data bit from the memory cell assigned the row and column addresses indicated by the first row and column address bits, and the second row address decoder/word line driver unit 22b selectively energizes the second word lines WL21 to WL2m for writing a write-in data bit into the memory cell assigned the row and column addresses indicated by second row and column address bits.

On the other hand, the plurality of sets of bit lines BL1a/BL1b/BL1c to BLna/BLnb/BLnc are respectively associated with the columns of memory cells M11 to Mm1, . . . and M1n to Mmn. Two bit lines BL1a/BL1b or BLna/BLnb of each set are paired with each other for forming a bit line pair available, and the bit line pair propagates the write-in data bit to the selected memory cell. However, the other bit lines BL1c to BLnc extend without bit lines to be paired therewith, and are selectively used in a data access or the read-out operation. Therefore, the read-out data bit is propagated along the selected bit line as a high or low voltage level.

Thus, the first word lines WL11 to WL11m and the bit line pairs BL1a/BL1b to BLna/BLnb are provided for the data access, and the second word lines WL21 to WL2m and the bit lines BL1c to BLnc are exclusively used in the write-in operation. The data access and the write-in operation are independently carried out.

Turning to FIG. 2 of the drawings, the memory cell M11 has a pair of memory nodes N11 and N12, and a potential difference indicative of a stored data bit is maintained between the memory nodes N11 and N12. The other memory cells are similar in arrangement to the memory cell M11, and, for this reason, no description is made on the other memory cells.

The memory cell M11 comprises a first series combination of a load resistor R11 and an n-channel enhancement type switching transistor Qn11 coupled between a positive power voltage line Vcc and a ground voltage line, a second series combination of a load resistor R12 and an n-channel enhancement type switching transistor Qn12 coupled in parallel to the first series combination, a pair of n-channel enhancement type switching transistors Qn13 and Qn14 coupled between the memory nodes N11/N12 and the bit lines BL1a and BL1b, an n-channel enhancement type level-detecting transistor Qn15 coupled at the source node thereof with the ground voltage line, an n-channel enhancement type switching transistor Qn16 coupled between the n-channel enhancement type level-detecting transistor Qn15 and the bit line BL1c and a capacitor CP1 coupled between the memory node N11 and the ground voltage line.

The gate electrode of the n-channel enhancement type switching transistor Qn11 is connected with the memory node N12, and the gate electrode of the n-channel enhancement type switching transistor Qn12 is connected with the memory node N11. The n-channel enhancement type switching transistors Qn11 and Qn12 complementarily turn on and off so as to maintain a potential difference between the memory nodes N11 and N12. In other words, the series combinations serve as a flip flop circuit for storing the data bit in the form of potential difference between the memory nodes N11 and N12. Thus, the flip-flop circuit implements a memory circuit.

The n-channel enhancement type switching transistors Qn13 and Qn14 are simultaneously gated by the second word line WL21, and the memory nodes N11 and N12 are electrically connected through the n-channel enhancement type switching transistors Qn13 and Qn14 with the bit lines BL1a and BL1b, respectively, for taking in a potential difference between the bit lines BL1a and BL1b in the write-in operation.

On the other hand, the n-channel enhancement type switching transistor Qn16 is gated by the first word line WL11 in the read-out operation on the memory cell M11, and the n-channel enhancement type level-detecting transistor Qn15 turns on or off depending upon the voltage level at the memory node N12. This means that the n-channel enhancement type level-detecting transistor Qn15 provides or cuts off a current path from the bit line BL1c to the ground voltage line, and changes the data bit in the form of potential difference between the memory nodes N11 and N12 to the data bit in the form of a voltage level. For this reason, the n-channel enhancement type level-detecting transistor Qn15 serves as a converting circuit.

The capacitor CP1 aims at cancelling of a parasitic capacitance coupled with the memory node N12, and the capacitance of the capacitor CP1 is adjusted to the parasitic capacitance. Most of the parasitic capacitance is formed by the capacitance between the gate electrode and the source/drain of the n-channel enhancement type switching transistor Qn15.

P-channel enhancement type load transistors Qp17, Qp18 and Qp19 are coupled between the positive power voltage line Vcc and the bit lines BL1a/BL1b/BL1c, and form parts of the charging circuit 22. The gate electrodes of the p-channel enhancement type load transistors Qp17 to Qp19 are grounded, and current is supplied from the positive power voltage line Vcc to the bit lines BL1a/BL1b/BL1c. As a result, while all of the memory nodes of the column of memory cells are electrically isolated from the bit lines BL1a/BL1b/BL1c, the p-channel enhancement type load transistors Qp17 to Qp19 charge the bit lines BL1a/BL1b/BL1c to the positive power voltage level. Though not shown in FIG. 2, the bit line sets BL1a/BL1b/BL1c to BLna/BLnb/BLnc are respectively associated with a plurality of p-channel enhancement type load transistor sets each implemented by the p-channel enhancement type load transistors Qp17/Qp18/Qp19, and all of the bit lines BL1a/BL1b/BL1c to BLna/BLnb/BLnc are charged to the positive power voltage level while the first and second row address decoder/word line driver units 22a and 22b keep the first and second word lines WL11 to WL1m and WL21 to WL2m in the inactive ground voltage level.

The asynchronous static random access memory device thus arranged behaves as follows. Assuming now that an external device needs to rewrite a data bit into the memory cell M11, the external device supplies the second row address bits indicative of the row address assigned to the memory cell M11 and the second column address bits indicative of the column address assigned to the memory cell M11 to the second row address decoder/ word line driver unit 22b and the second column address decoder unit 25b, respectively. The charging circuit 22 has already charged the bit lines BL1a/BL1b/BL1c to the positive power voltage level, and the input circuit 26 produces a potential difference indicative of a write-in data bit supplied from the outside thereof. The column address decoder unit 25b causes the associated column selector to transfer the potential difference to the bit line pair BL1a/BL1b, and the row address decoder/word line driver unit 22b energizes the word line WL21 so that the n-channel enhancement type switching transistors Qn13 and Qn14 turn on. As a result, the potential difference indicative of the write-in data bit is transferred from the bit lines BL1a/BL1b to the memory nodes N11 and N12 of the memory cell M11, and one of the n-channel enhancement type switching transistors Qn11/Qn12 turns off for discharging the electric charges on the associated bit line BL1a or BL1b. Upon completion of the write-in operation, the word line WL21 causes the n-channel enhancement type switching transistors Qn13 and Qn14 to turn off, and the n-channel enhancement type switching transistors Qn13 and Qn14 isolate memory nodes N11 and N12 of the memory cell M11 from the bit line pair BL1a/BL1b.

If the external device accesses the data bit stored in the memory cell M11, the row address decoder/word line driver unit 22a and the column address decoder unit 25a respectively decode the first row address bits indicative of the row address assigned to the memory cell M11 and the first column address bits indicative of the column address assigned to the memory cell M11. Then, the row address decoder/word line driver unit 22a energizes the word line WL11, and the column address decoder unit 25a causes the associated column selector to couple the bit line BL1c with the sense amplifier 23. The word line WL11 allows the n-channel enhancement type switching transistor Qn16 to turn on, and the drain node of the n-channel enhancement type level-detecting transistor Qn15 is coupled through the n-channel enhancement type switching transistor Qn16 with the bit line BL1c. If the positive power voltage level is maintained at the memory node N12, the bit line BL1c is discharged, and the potential decay on the bit line BL1c is propagated through the column selector to the sense amplifier 23. On the other hand, if the memory node N12 maintains the ground voltage level, the n-channel enhancement type level-detecting transistor Qn15 is turned off, and the bit line BL1c is maintained at the positive power voltage level. In either case, the sense amplifier 23 accelerates the potential change on the bit line BL1c, and the output circuit 27 produces an output data signal indicative of the read-out data bit. The output data signal is supplied to the output data port Dout.

If the first row and column address bits indicative of the memory cell M11 and the second row and column address bits also indicative of the memory cell M11 are simultaneously supplied to the asynchronous static random access memory device, the first and second row address decoder/word line driver units 22a and 22b energize the first and second word lines WL11 and WL21, and the first and second column address decoder units 25a and 25b cause the column selectors 24 to couple the set of bit lines BL1a/BL1b/BL1c with the sense amplifier 23 and the input circuit 26. The potential difference indicative of the write-in data bit is transferred through the bit line pair BL1a/BL1b to the memory nodes N11 and N12, and the new potential level at the memory node N12 causes the n-channel enhancement type level-detecting transistor Qn15 to maintain or discharge the potential level on the bit line BL1c. The sense amplifier 23 accelerates the potential change on the bit line BL1c, and the write-in data bit is read out through the memory cell M11 to the outside thereof.

As will be appreciated from the foregoing description, the read-out data bit is propagated through the single bit line in the form of voltage level, and only the three bit lines are associated with each column of memory cells. For this reason, the total number of bit lines is decreased in accordance with the present invention, and the semiconductor chip 20 is scaled down. Moreover, each of the n-channel enhancement type switching transistors Qn11 and Qn12 is expected to discharge only one bit line, and is smaller in size than the n-channel enhancement type switching transistors Qn5 and Qn6 of the prior art memory cell. This means that the semiconductor chip 20 is further scaled down.

Although particular embodiments of the present invention have been shown and described, it will be obvious to those skilled in the art that various changes and modifications may be made without departing from the spirit and scope of the present invention. For example, an arbiter may be incorporated in an asynchronous static random access memory device according to the present invention, and retards a read-out operation when an external device requests a read-out operation on a memory cell to which a write-in operation is just carried out.

What is claimed is:

1. An asynchronous static random access memory device fabricated on a semiconductor chip, comprising:
   a) a plurality of first word lines selectively energized in a read-out operation;
   b) a plurality of second word lines selectively energized in a write-in operation;
   c) a plurality of first bit lines;
   d) a plurality of second bit lines respectively paired with said plurality of first bit lines for forming a plurality of bit line pairs;
   e) a plurality of third bit lines respectively associated with said plurality of bit line pairs for forming a plurality of bit line sets;
   f) a charging circuit coupled between a first source of voltage level and said plurality of bit line sets for supplying current to said plurality of bit line sets; and
   g) a plurality of memory cells selectively associated with said plurality of first word lines, said plurality of second word lines and said plurality of bit line sets for said read-out operation and said write-in operation,
   each of said plurality of memory cells comprising:
   g-1) a memory circuit having a resistor, a first memory node and a first switching transistor coupled between a first power voltage line and a second power voltage line different in potential level and a series of a second resistor, a second memory node and a second switching transistor coupled between said first power voltage line and said second power voltage line, said first memory node and said second memory node being respectively connected to a gate electrode of said second switching transistor and a gate electrode of said first switching transistor for storing a potential difference indicative of a data bit,
   g-2) a pair of first switching transistors coupled between said first and second memory nodes and said bit line pair, and gated by one of said plurality of second word lines,
   g-3) a converting circuit responsive to a voltage level at one of said first and second memory nodes for changing a voltage level on one of said plurality of third bit lines,
   g-4) a second switching transistor coupled between said one of said plurality of third bit lines and said converting circuit, and gated by one of said plurality of first word lines for enabling said converting circuit to change said voltage level on said one of said plurality of third bit lines, and
   g-5) a capacitive element coupled with the other of said first and second memory nodes for canceling a parasitic capacitance due to said converting circuit.

2. The asynchronous static random access memory device as set forth in claim 1, in which said charging circuit comprises a plurality of load transistor sets coupled between said first source of voltage level and said plurality of bit line sets.

* * * * *